(12) United States Patent
Nakata

(10) Patent No.: US 11,527,580 B2
(45) Date of Patent: Dec. 13, 2022

(54) SEMICONDUCTOR DEVICE, DISPLAY IMAGING APPARATUS, PHOTOELECTRIC CONVERSION APPARATUS, ELECTRONIC DEVICE, ILLUMINATION APPARATUS, AND MOVING BODY

(71) Applicant: CANON KABUSHIKI KAISHA, Tokyo (JP)

(72) Inventor: Norihiko Nakata, Kanagawa (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 227 days.

(21) Appl. No.: 17/102,176

(22) Filed: Nov. 23, 2020

(65) Prior Publication Data
US 2021/0167133 A1 Jun. 3, 2021

(30) Foreign Application Priority Data
Nov. 29, 2019 (JP) .............................. JP2019-216773

(51) Int. Cl.
| | |
|---|---|
| *H01L 27/32* | (2006.01) |
| *F21V 3/00* | (2015.01) |
| *F21S 43/145* | (2018.01) |
| *F21S 43/20* | (2018.01) |
| *H04N 5/232* | (2006.01) |
| *G06F 3/01* | (2006.01) |
| *H01L 51/52* | (2006.01) |
| *F21Y 115/15* | (2016.01) |
| *G02B 5/20* | (2006.01) |

(52) U.S. Cl.
CPC .......... *H01L 27/322* (2013.01); *F21S 43/145* (2018.01); *F21S 43/26* (2018.01); *F21V 3/00* (2013.01); *G06F 3/013* (2013.01); *H01L 51/5246* (2013.01); *H04N 5/23293* (2013.01); *F21Y 2115/15* (2016.08); *G02B 5/201* (2013.01)

(58) Field of Classification Search
None
See application file for complete search history.

(56) References Cited

U.S. PATENT DOCUMENTS

2017/0236879 A1\* 8/2017 Kubota ................ G02B 27/017
257/40

FOREIGN PATENT DOCUMENTS

JP S61251804 A 11/1986

\* cited by examiner

*Primary Examiner* — Elmito Breval
(74) *Attorney, Agent, or Firm* — Canon U.S.A., Inc. IP Division

(57) ABSTRACT

A semiconductor device includes a first substrate, a semiconductor device includes a first substrate, a color filter layer over the first substrate in an effective pixel region, a second substrate over the color filter layer, a joint member joining the first and second substrates, and a pattern layer over the first substrate outside the effective pixel region. The color filter layer has a color filter material and the pattern layer has the color filter material. In a planar view with respect to a surface of the first substrate on which the joint member is disposed, the pattern layer is disposed between two portions of the joint member, the two portions being separate from and adjacent to each other. In the planar view, the joint member is not disposed between the pattern layer and an end of the first substrate closest to the pattern layer among ends of the first substrate.

20 Claims, 12 Drawing Sheets

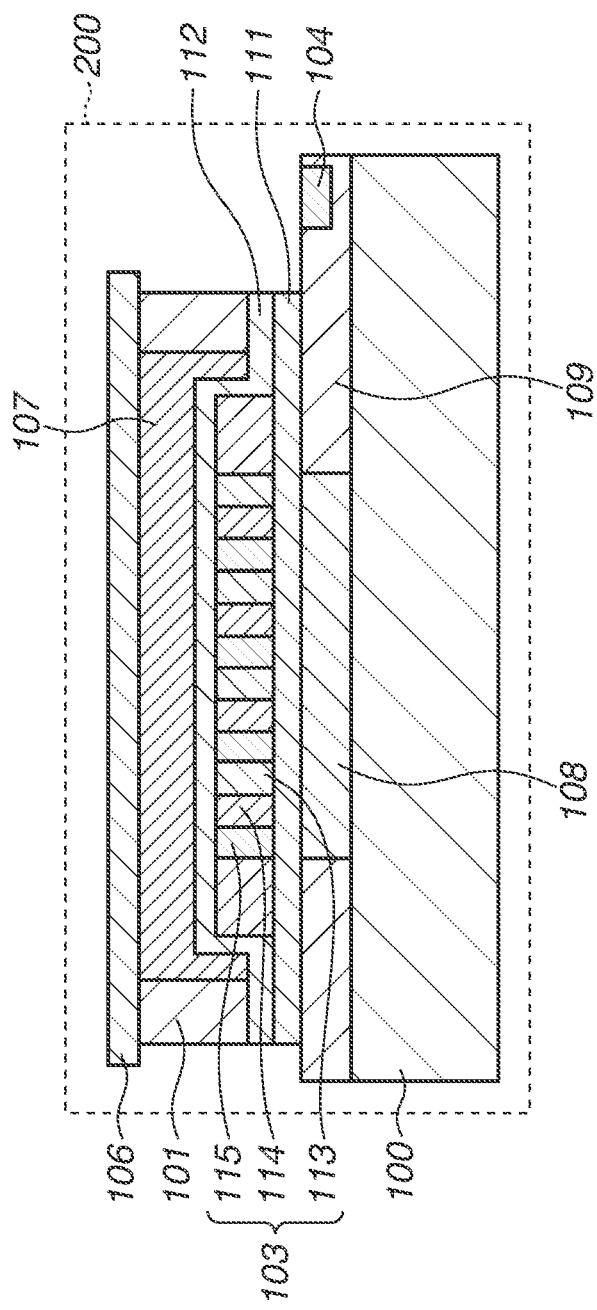

SEMICONDUCTOR DEVICE, DISPLAY IMAGING APPARATUS, PHOTOELECTRIC CONVERSION APPARATUS, ELECTRONIC DEVICE, ILLUMINATION APPARATUS, AND MOVING BODY

BACKGROUND

Field

The aspect of the embodiments relates to a semiconductor device including a color filter layer, a display imaging apparatus, a photoelectric conversion apparatus, an electronic device, an illumination apparatus, and a moving object.

Description of the Related Art

In semiconductor devices that perform display or imaging, a color filter layer is provided to display or capture a color image. Some semiconductor devices including the color filter layer include a pattern layer having the same material as that of the color filter layer, separately from the color filter layer disposed on effective pixels. As an example, to check the operation of the semiconductor device or manage the quality of the semiconductor device, various monitor pixels or other patterns that do not function as effective pixels are arranged. Japanese Patent Application Laid-Open No. 61-251804 discusses a display apparatus including a color filter layer, and monitor pixels for managing the color filter layer.

Various monitor pixels and patterns including a color filter material that do not function as effective pixels need to be arranged out of an effective pixel region and the vicinity thereof so that the characteristics of a semiconductor device do not deteriorate. Thus, the provision of such a pattern results in upsizing of the semiconductor device.

In response, in the disclosure, a miniaturized semiconductor device is provided.

SUMMARY

According to an aspect of the embodiments, a semiconductor device includes a first substrate, a color filter layer over the first substrate in an effective pixel region, a second substrate over the color filter layer, a joint member joining the first and second substrates, and a pattern layer over the first substrate outside the effective pixel region. The color filter layer has a color filter material and the pattern layer has the color filter material. In a planar view with respect to a surface of the first substrate on which the joint member is disposed, the pattern layer is disposed between two portions of the joint member, the two portions being separate from and adjacent to each other. In the planar view, the joint member is not disposed between the pattern layer and an end of the first substrate closest to the pattern layer among ends of the first substrate.

Further features of the disclosure will become apparent from the following description of exemplary embodiments with reference to the attached drawings.

BRIEF DESCRIPTION OF THE DRAWINGS

FIG. 2 is a schematic sectional view illustrating the example of an semiconductor device.

DESCRIPTION OF THE EMBODIMENTS

With reference to the accompanying drawings, exemplary embodiments will be described below. In the following description and the drawings, components common to a plurality of drawings are designated by common signs. Accordingly, common components are described with reference to a plurality of drawings, and the descriptions of components, materials, methods, and effects designated by common signs are appropriately omitted.

Figure 1A:
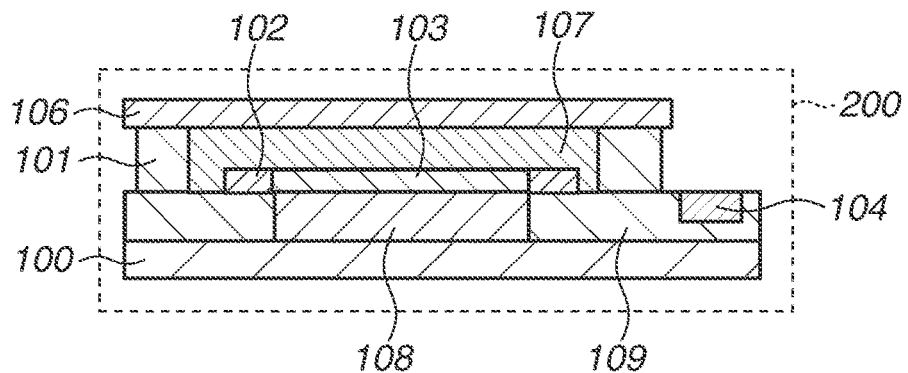
FIG. 1A is a schematic sectional view illustrating an example of a semiconductor device.

A first exemplary embodiment of the disclosure will be described below. FIG. 1A is a sectional view of a semiconductor device 200. The semiconductor device 200 includes an element substrate 100, a color filter layer 103, and a light blocking layer 102 placed around the color filter layer 103. The semiconductor device 200 includes a light transmission plate 106 placed opposed to the color filter layer 103, and a joint member 101 that joins the light transmission plate 106 and the element substrate 100. As illustrated in FIG. 1A, the semiconductor device 200 may further include a light transmission member 107 that is provided between the color filter layer 103 and the light transmission plate 106 and is in contact with the light transmission plate 106.

The semiconductor device 200 according to the present exemplary embodiment can be used in, for example, a display apparatus or an imaging apparatus. In such a case, the element substrate 100 is a display element substrate or an imaging element substrate. The semiconductor device 200 includes an effective pixel region 108, a peripheral circuit region 109, and an external connection terminal 104.

Figure 1B:
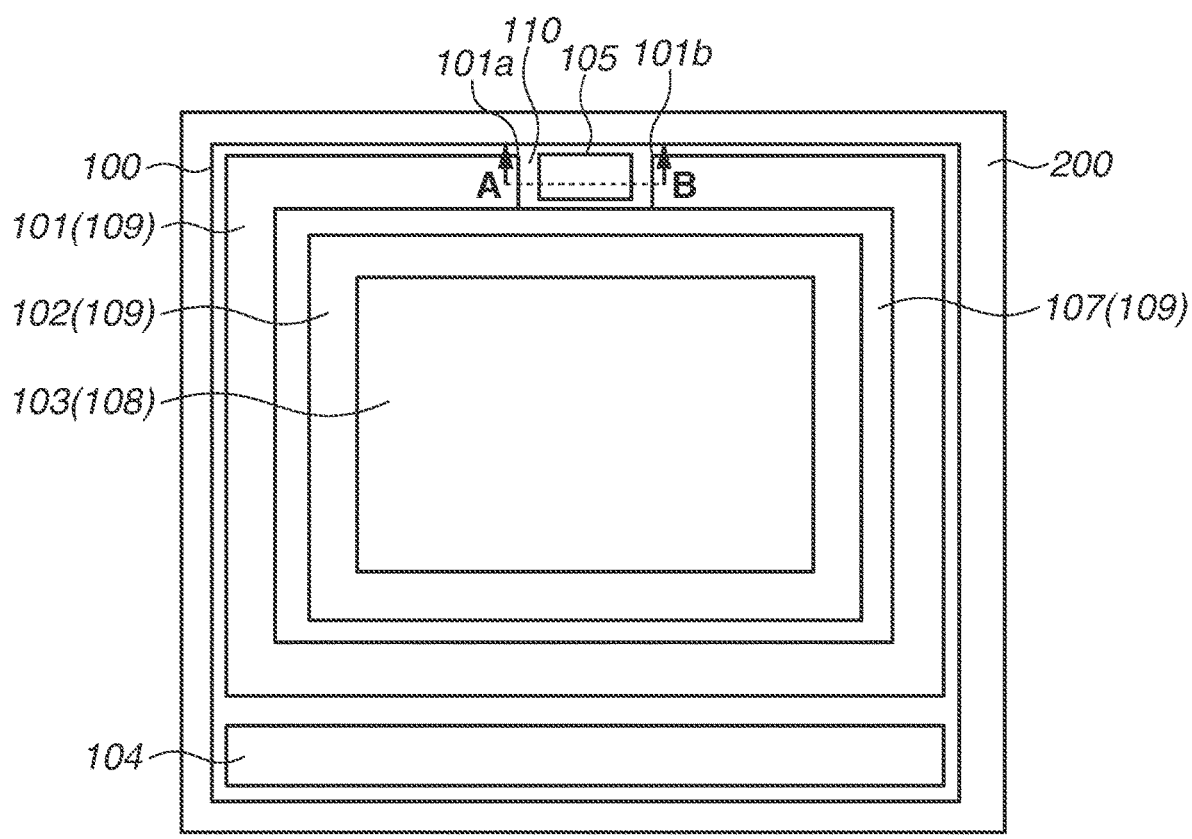
FIG. 1B is a schematic top view illustrating an example of the semiconductor device.

FIG. 1B illustrates a schematic plan view of the semiconductor device 200 in a planar view with respect to a main surface (a surface on which the joint member 101 is disposed) of the element substrate 100. In FIG. 1B, it is possible to see through members overlapping the main surface of the element substrate 100 when the semiconductor device 200 is viewed from a direction perpendicular to the main surface (the direction of a normal to the main surface) of the element substrate 100.

The semiconductor device 200 includes the element substrate 100, the color filter layer 103 disposed over the element substrate 100 in the effective pixel region 108, the light transmission plate 106 disposed over the color filter layer 103, and the joint member 101 that joins the element substrate 100 and the light transmission plate 106. The semiconductor device 200 includes a pattern layer 105 disposed over the element substrate 100 outside the effective pixel region 108 and having the same material as that of the color filter layer 103.

In the planar view with respect to the surface of the element substrate 100 on which the joint member 101 is disposed, the pattern layer 105 is disposed in a cutout 110 of the joint member 101, i.e., between two portions of the joint member 101 that are separate from and adjacent to each other. In this planar view, the joint member 101 is not disposed between an end of the element substrate 100 and the pattern layer 105. That is, in this planar view, the joint member 101 is not disposed between the pattern layer 105 and the closest end to the pattern layer 105 among the ends of the element substrate 100. In other words, the pattern layer 105 is disposed on a virtual straight line AB (in a mathematically strict sense, a virtual line segment AB) connecting the two portions of the joint member 101 that are separate from and adjacent to each other. At this time, in this planar view, the joint member 101 and the virtual straight line AB (or the virtual line segment AB) surround the effective pixel region 108. Further, in other words, in the planar view with respect to the surface of the element substrate 100 on which the joint member 101 is disposed, one end 101a and the other end 101b of the joint member 101 are disposed facing each other. In this planar view, the virtual straight line AB connecting the one end 101a and the other end 101b of the joint member 101 and the joint member 101 surround the effective pixel region 108, and the pattern layer 105 is disposed on the virtual straight line AB.

Thus, the two portions of the joint member 101 that are separate from and adjacent to each other and the pattern layer 105 are disposed side by side on a straight line parallel to an outer edge of at least a part of the effective pixel region 108 and not passing through the effective pixel region 108.

The color filter layer 103 is placed covering at least the entirety of an upper surface of the effective pixel region 108, but may be placed over the peripheral circuit region 109 outside the effective pixel region 108. The color filter layer 103 has the function of controlling the wavelength of light passing through each pixel, and in the present exemplary embodiment, employs three colors, namely red, green, and blue. The number of colors and the types of colors, however, are not limited to these. The film thickness of the color filter layer 103 can be 0.5 to 3 µm, for example. The size of each pixel in the color filter layer 103 can be set so that the distance between opposite sides of the pixel is 1.5 to 50 µm, for example. In the present exemplary embodiment, the shape of each pixel in the color filter layer 103 is a hexagon, but may be a polygon, such as a square or a rectangle.

In the peripheral circuit region 109, metal wiring is formed. Thus, the metal wiring may reflect light, which may degrades the characteristics of the semiconductor device 200. The light blocking layer 102 is disposed around the color filter layer 103 disposed over the effective pixel region 108, which prevents reflection of light in the peripheral circuit region 109.

As described above, the joint member 101 includes the cutout 110. The cutout 110 is used to, for example, inject the light transmission member 107. The cutout 110 is a portion where the two portions of the joint member 101 are separate from and via which the two portions face each other (a portion between the one end 101a and the other end 101b). The width of the cutout 110 may be 1 to 30 mm, for example.

The pattern layer 105 has the same color filter materials as those of the color filter layer 103 in the effective pixel region 108. Examples of the function of the pattern layer 105 include the function of managing the quality of the color filter layer 103. Using a mask similar to a product, a similar method, and a similar material, the pattern layer 105 (and the color filter layer 103) is formed over a glass substrate, so that it is possible to make transmission spectrometric measurement.

In a case where the pattern layer 105 using the same color filter materials as those of the color filter layer 103 in the effective pixel region 108 is used in transmission spectrometric measurement, if the pattern layer 105 having the same pixel size as that of the color filter layer 103 is used, the pixel size of the pattern layer 105 becomes smaller than that of a spot diameter of the spectrometric measurement apparatus. Thus, the pattern layer 105 having a pixel size greater than the pixel size of the color filter layer 103 is formed using the same color filter materials as those of the color filter layer 103 in the effective pixel region 108. Transmission spectrometric measurement is performed on the pattern layer 105, so that it is possible to check whether the color filter layer 103 in the effective pixel region 108 is formed as designed.

If the pattern layer 105 is placed between the light blocking layer 102 and the joint member 101, it is necessary to provide a space for the pattern layer 105, which upsizes semiconductor device 200. On the other hand, the pattern layer 105 according to the present exemplary embodiment is placed in the cutout 110 included in the joint member 101.

In other words, in the planar view with respect to the surface of the element substrate 100 on which the joint member 101 is disposed, the pattern layer 105 according to the present exemplary embodiment is placed in the portion where the two portions of the joint member 101 are separate and via which the two portions face each other. In this planar view, the joint member 101 is not disposed between the end of the element substrate 100 and the pattern layer 105. In other words, in the planar view with respect to the surface of the element substrate 100 on which the joint member 101 is disposed, the one end 101a and the other end 101b of the joint member 101 are disposed facing each other. In this planar view, the virtual straight line AB connecting the one end 101a and the other end 101b of the joint member 101 and the joint member 101 surround the effective pixel region 108, and the pattern layer 105 is disposed on the virtual straight line AB.

Thus, it is not necessary to provide a dedicated space, so that it is possible to provide a further miniaturized semiconductor device 200.

The pattern layer 105 includes layers of a plurality of colors similar to those of the color filter layer 103, and in the present exemplary embodiment, includes layers similar to color filter layers of red, green, and blue. In the planar view illustrated in FIG. 1B, the area per pattern unit of a certain color of the pattern layer 105 is different in size from the area per pixel of the same color of the color filter layer 103. More specifically, it is desirable that the area per pattern unit of a certain color of the pattern layer 105 should be greater than the area per pixel of the same color of the color filter layer 103. In terms of transmission spectroscopic analysis, it is desirable that the area per pattern unit of a certain color of the pattern layer 105 should be, for example, 1.5 times or more the area per pixel of the same color of the color filter layer 103. Moreover, it is desirable that the color filter layer 103 and the pattern layer 105 should be separate from each other.

In the present exemplary embodiment, the light blocking layer 102 is formed of the same material as that of the blue color filter used in the color filter layer 103, and simultaneously with the color filter layer 103. Consequently, it is possible to shorten a manufacturing step. To further enhance the light blocking performance, the light blocking layer 102 may be formed by overlaying layers (filter layers) having color filter materials of two or more colors used in the color filter layer 103. For example, the light blocking layer 102 may be formed by overlaying layers having color filter materials of two colors, namely red and blue, used in the color filter layer 103, or may be formed by overlaying layers having color filter materials of three colors, namely red, green, and blue, used in the color filter layer 103, or may be formed of a black color filter.

It is desirable that in the planar view illustrated in FIG. 1B, the light blocking layer 102 should be disposed around the effective pixel region 108. Consequently, it is possible to effectively prevent the situation where light incident from outside is reflected by wiring, and light different from light to be emitted from the semiconductor device 200 normally is emitted, or effectively prevent the situation where light from outside an imaging region is incident on the imaging region. Thus, in the planar view illustrated in FIG. 1B, it is desirable that the light blocking layer 102 should be disposed also between the color filter layer 103 and the joint member 101.

If the distance between the joint member 101 and the pattern layer 105 is small, and the joint member 101 overlies the pattern layer 105, joining through the color filter materials between the light transmission plate 106 and the element substrate 100 decreases the joining reliability. Thus, the adhesive action of the joint member 101 may decrease. On the other hand, the distance from the joint member 101 to the end of the element substrate 100 is made small, so that the semiconductor device 200 is further miniaturized. Thus, it is desirable that the distance between the joint member 101 and the pattern layer 105 should be greater than the distance between the joint member 101 and the end of the element substrate 100.

The distance between the joint member 101 and the pattern layer 105 can be 300 µm or more and 700 µm or less, for example. In terms of the joining reliability, it is more desirable that the distance between the joint member 101 and the pattern layer 105 should be 500 µm or more and 700 µm or less.

If a region of the light blocking layer 102 disposed outside the effective pixel region 108 is made small, light incident from outside may not be reflected by the light blocking layer 102 and may be reflected by wiring. Thus, light different from light to be emitted from the semiconductor device 200 normally may be emitted. If the semiconductor device 200 is used in a portion of an imaging apparatus, light from outside an imaging region may be incident on the imaging region. If, on the other hand, the distance between the light blocking layer 102 and the joint member 101 is insufficient, the light blocking layer 102 may overlap (overlies) the joint member 101. In such a case, joining through the color filter materials between the light transmission plate 106 and the element substrate 100 decreases the joining reliability. Thus, the adhesive action of the joint member 101 may decrease.

Thus, in the semiconductor device 200 according to the present exemplary embodiment, the distance between the light blocking layer 102 and the joint member 101 is smaller than the distance from the light blocking layer 102 at the end thereof adjacent to the joint member 101 to the color filter layer 103. However, depending on the shape or the size of the element substrate 100 or the light blocking layer 102, the light blocking layer 102 may overlie the joint member 101, and the adhesiveness between the element substrate 100 and the light transmission plate 106 may decrease. In such a case, the distance between the light blocking layer 102 and the joint member 101 may be greater than the distance from the light blocking layer 102 at the end thereof adjacent to the joint member 101 to the color filter layer 103.

In the present exemplary embodiment, the distance from the light blocking layer 102 at the end thereof adjacent to the joint member 101 to the color filter layer 103 (the width of the light blocking layer 102) can be 30 µm or more and 400 µm or less, more desirably, 50 µm or more and 350 µm or less. It is desirable that the distance between the light blocking layer 102 and the joint member 101 should be 10 µm or more, for example. It is more desirable that the distance between the light blocking layer 102 and the joint member 101 should be 20 µm or more.

In the present exemplary embodiment, an example is illustrated where the distance from the pattern layer 105 to the end of the element substrate 100 is smaller than the distance from the pattern layer 105 to the one end 101a of the joint member 101. In this manner, it is possible to further miniaturize the semiconductor device 200. The semiconductor device 200, however, is not limited to this embodiment. The distance from the pattern layer 105 to the end of the element substrate 100 may be greater than the distance from the pattern layer 105 to (the one end 101a of) the joint member 101. In such a case, the proportion of the cutout 110 to a region where the joint member 101 is disposed is small. Thus, it is possible to improve the joining reliability of the element substrate 100 and the light transmission plate 106.

In the present exemplary embodiment, the distance between the pattern layer 105 and the joint member 101 (the one end 101a of the joint member) is smaller than the distance between the pattern layer 105 and the light blocking layer 102. Thus, it is possible to prevent the situation where the light blocking layer 102 overlies the pattern layer 105 or the joint member 101, and the joining reliability decreases.

The pattern layer 105 and the light blocking layer 102 may both include a plurality of layers having the same color filter materials as those of the color filter layer 103. In a case where transmission spectrometric measurement is performed, the pattern layer 105 is formed over a translucent substrate such as a glass substrate. Thus, if the distance between the pattern layer 105 and the color filter layer 103 is small, light for exposure for forming the layers may pass through the substrate, then be reflected, and be emitted to the substrate again, so that the layers having the color filter materials may be formed in a portion different from the design. If such a situation occurs, the reliability of the transmission spectrometric measurement significantly decreases.

Thus, the distance between the pattern layer 105 and (the one end 101a of) the joint member 101 is smaller than the distance between the pattern layer 105 and the light blocking layer 102, so that it is possible to prevent the pattern layer 105 or the light blocking layer 102 from deviating from a desired pattern.

On the other hand, in the semiconductor device 200, the distance between the pattern layer 105 and the light blocking layer 102 may be smaller than the distance between the pattern layer 105 and the joint member 101 (the one end 101a of the joint member 101). This configuration prevents the situation where unnecessary light from outside enters into the semiconductor device 200 through a portion where the light blocking layer 102 is not disposed, and decreases the performance.

It is desirable that the thickness of the joint member 101 should be greater than those of the color filter layer 103 and the light blocking layer 102. It is desirable that the thickness of the joint member 101 should be 2 μm or more, for example. The thickness of the joint member 101 may be about 50 μm.

To prevent the situation where the joint member 101 overlies the external connection terminal 104, and the joining reliability decreases, and prevent the situation where the connection area of the external connection terminal 104 and an external terminal is reduced, it is desirable that the distance between the joint member 101 and the external connection terminal 104 should be at least 500 μm or more. It is more desirable that the distance between the joint member 101 and the external connection terminal 104 should be 700 μm or more.

In the present exemplary embodiment, an example has been illustrated where the pattern layer 105 is a pattern layer used for transmission spectrometric measurement. Alternatively, the pattern layer 105 may be any pixels that do not function as effective pixels, such as dummy pixels, reference pixels, test pixels, monitor pixels, and other patterns.

Next, with reference to a sectional view in FIG. 2, a description will be provided of a manufacturing method in a case where the semiconductor device 200 according to the present exemplary embodiment is used in an organic electroluminescent (EL) display apparatus.

In the effective pixel region 108 and the peripheral circuit region 109 of the element substrate 100, a semiconductor substrate, a semiconductor element, such as a transistor, a wiring structure, an organic EL element, and an insulating member are disposed. For the semiconductor substrate, for example, silicon can be used. Instead of the semiconductor substrate, a glass substrate or a plastic substrate may be used. For the wiring structure, a metal member made of aluminum or copper is used. To prevent metal diffusion to an insulating layer, a barrier metal, such as Ti, Ta, TiN, or TaN may be provided at the interface between the insulating member and the wiring structure.

The organic EL element may be formed on the entire surface of the effective pixel region 108 by sputtering or vapor deposition using a metal mask. For the insulating member, silicon oxide or silicon nitride is used. The insulating member is provided to ensure electrical insulation properties between the structures of the element substrate 100, such as between the semiconductor element and the wiring structure.

Immediately over the element substrate 100, a lower organic planarization film 111 is formed. The lower organic planarization film 111 may have the function of planarizing unevenness on the surface of the element substrate 100. The lower organic planarization film 111 may have the function of improving the adhesiveness with respect to the color filter layer 103 and the light blocking layer 102 with the element substrate 100.

The color filter layer 103 is in contact with the lower organic planarization film 111 and can be formed by color basis by photolithography. For the material of the color filter layer 103, a material having wavelength-dependent light transmittance and sensitive to light can be used, and a pigment-based material or a dye-based material is used. In the present exemplary embodiment, the color filter layer 103 includes color filters including a green filter 113, a red filter 114, and a blue filter 115. A filter of a certain color (a layer of a certain single color) in this case is a layer having high transmittance for the certain color. For example, the green filter 113 mainly transmits green of light emitted from the organic EL element.

Similarly, the light blocking layer 102 can also be formed by photolithography. The light blocking layer 102 may include a layer of the same color as at least one of those of the layers included in the color filter layer 103. In a case where the same material as that of the color filter layer 103 is used as the material of the light blocking layer 102, the light blocking layer 102 can be formed simultaneously with the color filter layer 103. Thus, it is possible to reduce the number of manufacturing steps. In the present exemplary embodiment, an example is illustrated where the light blocking layer 102 is a layer having the blue color filter material that is the same as that of the blue filter 115.

Over the color filter layer 103 and the light blocking layer 102, an upper organic planarization film 112 is formed. The upper organic planarization film 112 may have the function of planarizing the surfaces of the color filter layer 103 and the light blocking layer 102. The upper organic planarization film 112 may have the function of sealing the color filter layer 103 and the light blocking layer 102.

Figure 3:
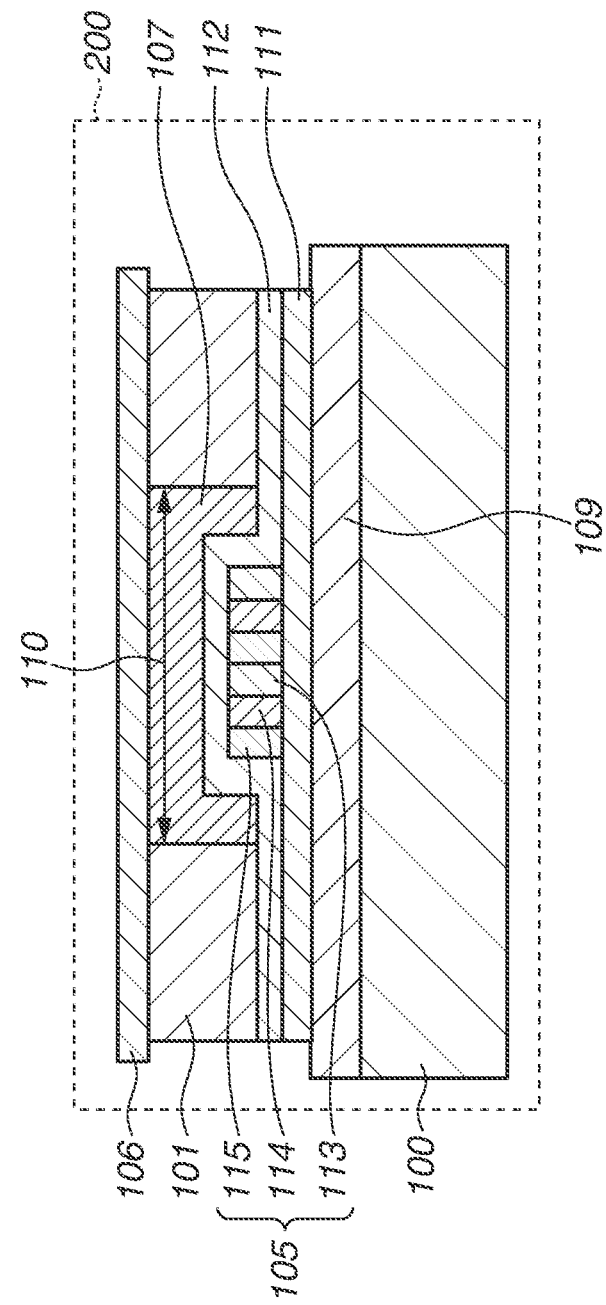
FIG. 3 is a schematic sectional view illustrating an example of the semiconductor device.

FIG. 3 is a sectional view of the pattern layer 105. The pattern layer 105 includes layers of the same plurality of colors as those of the color filter layer 103 in the effective pixel region 108. An example is illustrated where the same color filter materials as those of the color filter layer 103 are used for layers of respective colors of the pattern layer 105.

The pattern layer 105 is placed in the cutout 110 of the joint member 101. Since the same materials as those of the color filter layer 103 are used for the pattern layer 105, the forming of the pattern layer 105 simultaneously with the color filter layer 103 reduces the number of manufacturing steps. In FIG. 3, as in the color filter layer 103, a lower surface of the pattern layer 105 is in contact with the lower organic planarization film 111, and an upper surface of the pattern layer 105 is in contact with the upper organic planarization film 112.

A resin material for the joint member 101 is formed by a dispensing or screen printing technique. The joint member 101 is formed on the upper organic planarization film 112. If the joint member 101 comes into contact with the color filter materials, the joining reliability decreases. Thus, the joint member 101 is formed so as not to overlap the color filter layer 103, the light blocking layer 102, and the pattern layer 105 in a plan view.

For the joint member 101, any of an epoxy resin, an acrylic resin, a urethane resin, and a polyimide resin, such as an ultraviolet (UV) curable resin, a thermosetting resin, or a two-part resin, can be used. It is desirable that the resin should appropriately contain a filler. The including of the filler enables control of the gap between the semiconductor substrate 100 and the light transmission plate 106, since the thickness of the joint member 101 when the element substrate 100 and the light transmission plate 106 are bonded together is adjustable with the size of the filler, which is suitable. For the filler, any filler, such as glass beads or resin beads, can be used. It is, however, desirable to use resin beads that are less likely to damage the surface of the element substrate 100. In the joint member 101, the cutout 110 is provided.

After the light transmission plate 106 is bonded onto the joint member 101, the light transmission member 107 is injected through the cutout 110 using a vacuum injection method.

Figure 4A:
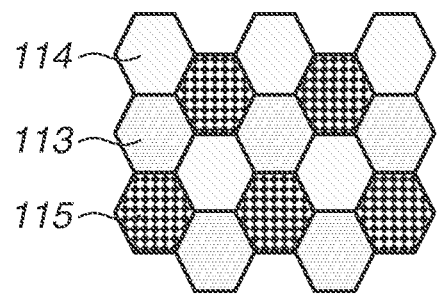
FIG. 4A is a schematic top view illustrating an example of a configuration of a color filter layer.
Figure 4B:
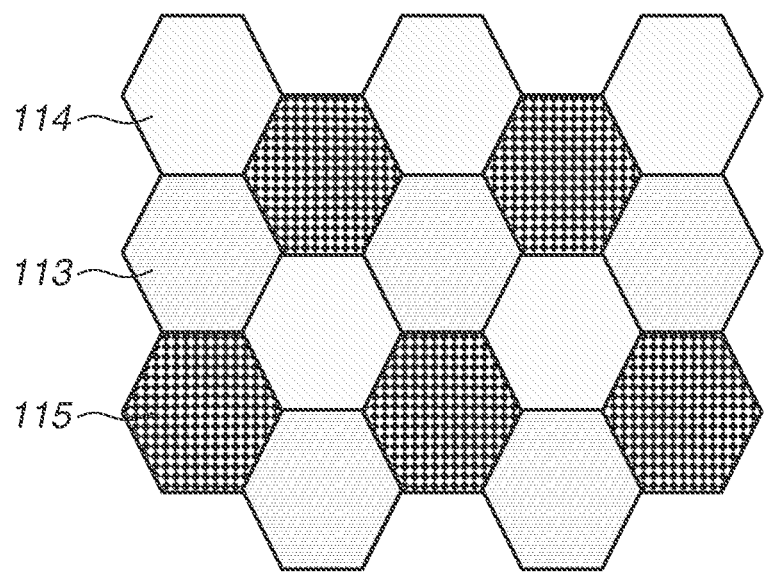
FIG. 4B is a schematic top view illustrating an example of a configuration of a pattern layer.

Next, a description will be provided of the shapes in the planar view of the color filter layer 103 and the pattern layer 105 of the semiconductor device 200 according to the present exemplary embodiment with reference to FIGS. 4A and 4B.

FIG. 4A illustrates a partial enlarged view of the color filter layer 103 in the planar view with respect to the surface of the element substrate 100 on which the joint member 101 is disposed. In the present exemplary embodiment, the color filter layer 103 includes layers having color filter materials of three colors of the green filter 113, the red filter 114, and the blue filter 115.

FIG. 4B illustrates a partial enlarged view of the pattern layer 105 in the planar view with respect to the surface of the element substrate 100 on which the joint member 101 is disposed. The pattern layer 105 includes layers having materials of the same colors as those of the color filter layer 103. Specifically, the pattern layer 105 includes layers having color filter materials of three colors of the green filter 113, the red filter 114, and the blue filter 115.

In the planar view in FIGS. 4A and 4B, the area per pattern unit of a certain color (e.g., the green filter 113) of the pattern layer 105 is greater than the area per pixel of the color (e.g., the green filter 113) of the color filter layer 103. In this way, the area per pattern unit of the pattern layer 105 is greater than the area size per pixel of the same color of the color filter layer 103. This enables, for example, the execution of the transmission spectrometric measurement in a case where the pixel size of the color filter layer 103 is smaller than the spot diameter of the spectrometric measurement apparatus. Thus, it is possible to improve the reliability of the color filter layer 103 of the semiconductor device 200.

Figure 5A:
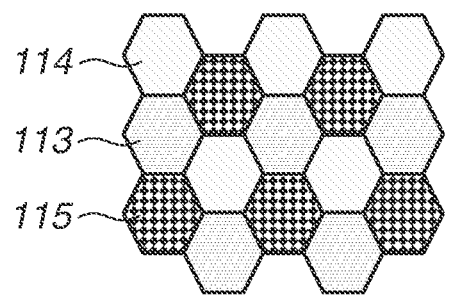
FIG. 5A is a schematic top view illustrating an example of a configuration of a color filter layer.
Figure 5B:
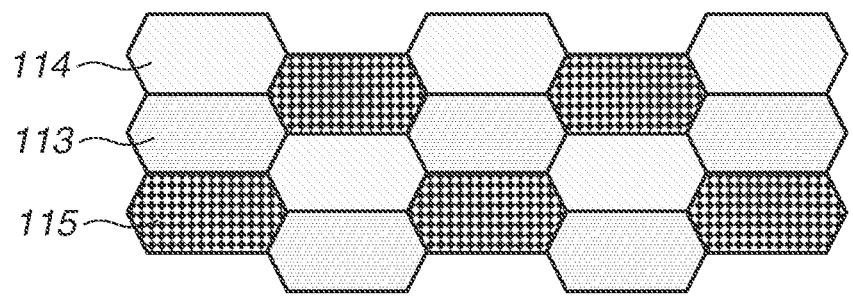
FIG. 5B is a schematic top view illustrating an example of a configuration of a pattern layer.

In FIGS. 4A and 4B, an example is illustrated where the shapes in the planar view of a layer included in the pattern layer 105 and a layer included in the color filter layer 103 are the same (including similar shapes). The semiconductor device 200, however, is not limited to this form. FIGS. 5A and 5B illustrate an example of another configuration. The configuration in FIG. 5A is similar to that of the color filter layer 103 in FIG. 4A, and thus, a description thereof is omitted. FIG. 5B illustrates a partial enlarged view of the pattern layer 105 in the planar view with respect to the surface of the element substrate 100 on which the joint member 101 is disposed.

FIG. 5B is similar to FIG. 4B in that the pattern layer 105 includes layers having materials of the same colors as those of the color filter layer 103. FIG. 5B, however, is different from FIG. 4B in that the shapes of the layers (filters) of the pattern layer 105 are different from the shapes of the layers (filters) of the color filter layer 103. The layers (filters) of the respective colors of the pattern layer 105 have a shape with the shape of the layers (filters) of the respective colors of the color filter layer 103 being extended in a single direction. Such a shape enables, for example, reducing of erroneous measurement in automatically measuring a line width.

A second exemplary embodiment of the disclosure will be described below. In the present exemplary embodiment, the shape of the joint member 101 is different from the shape of the joint member 101 of the semiconductor device 200 according to the first exemplary embodiment. Detailed descriptions of portions in the present exemplary embodiment common to the first exemplary embodiment are omitted.

Figure 6:
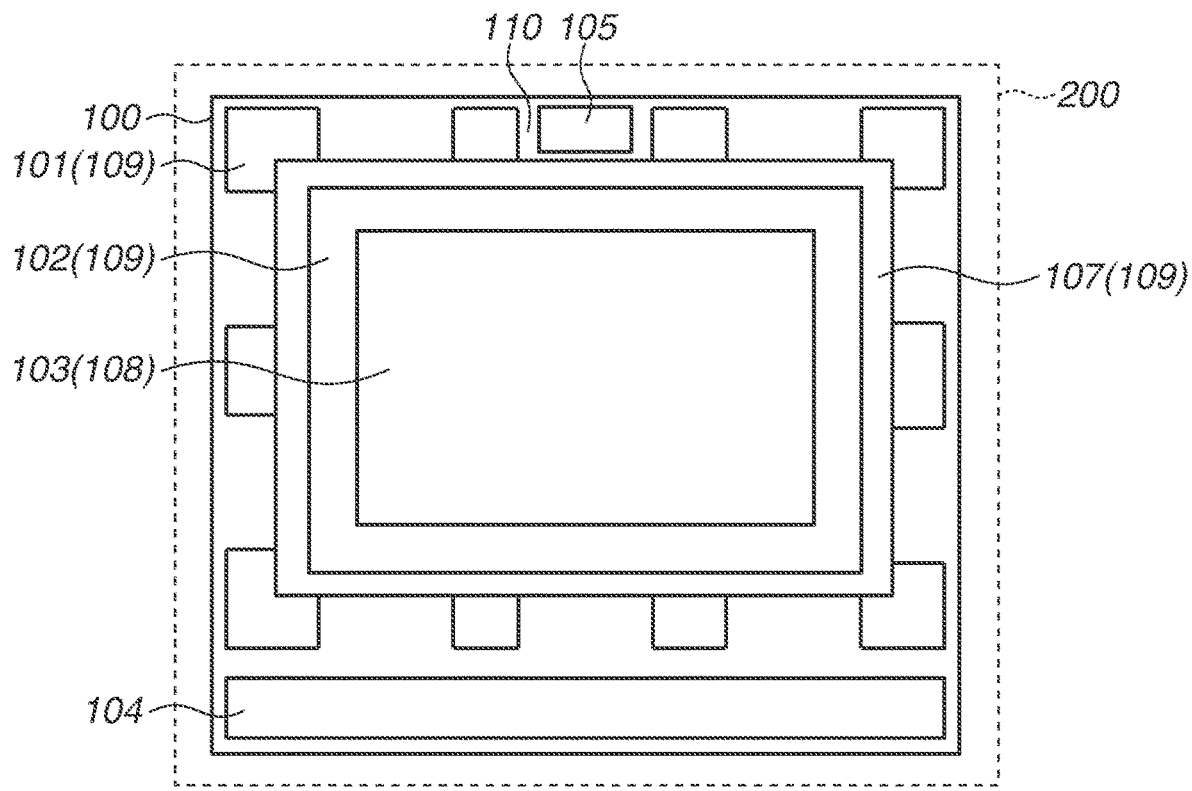
FIG. 6 is a schematic top view illustrating an example of a semiconductor device.

FIG. 6 illustrates a schematic top view of the semiconductor device 200 according to the present exemplary embodiment. In the first exemplary embodiment, the joint member 101 is disposed around the effective pixel region 108, and portions other than the cutout 110 are continuous. By contrast, in the semiconductor device 200 according to the present exemplary embodiment, the joint member 101 is disposed around the effective pixel region 108, but includes a plurality of cutouts 110.

Also in this case, the pattern layer 105 is disposed in the cutouts 110, so that it is not necessary to provide a space dedicated to the pattern layer 105, and therefore, it is possible to provide a further miniaturized semiconductor device 200.

Configuration of Organic Light-Emitting Element

A third exemplary embodiment of the disclosure will be described below. An organic light-emitting element is provided by forming an anode, an organic compound layer, and a cathode on a substrate. On the cathode, a protection layer and a color filter may be provided. In a case where the color filter is provided, a planarization layer may be provided between the color filter and the protection layer. The planarization layer can be formed of an acrylic resin.

Substrate

Examples of the substrate include quartz, glass, a silicon wafer, a resin, and a metal. A switching element, such as a transistor, and wiring may be provided on the substrate. An insulating layer may be provided over the switching element and the wiring, an insulating layer may be provided. The material of the insulating layer does not matter so long as a contact hole is formable to ensure conduction between the anode and the wiring, and insulation with wiring not connected to the anode can be ensured. For example, a polyimide resin, silicon oxide, or silicon nitride can be used.

Electrode

A pair of electrodes can be used for an electrode. The pair of electrodes may be an anode and a cathode. In a case where an electric field is applied in the direction in which the organic light-emitting element emits light, an electrode having a high potential is the anode, and the other is the cathode. It can also be said that an electrode that supplies holes to a light-emitting layer is the anode, and an electrode that supplies electrons to the light-emitting layer is the cathode.

It is desirable that the constituent material of the anode should have as great a work function as possible. For example, a metal simple substance, such as gold, platinum, silver, copper, nickel, palladium, cobalt, selenium, vanadium, and tungsten, a mixture containing these, or an alloy obtained by combining these can be used. For example, a metal oxide, such as tin oxide, zinc oxide, indium oxide, indium tin oxide (ITO), and indium zinc oxide can be used. Further, a conductive polymer, such as polyaniline, polypyrrole, and polythiophene can also be used.

One type of these electrode substances may be used alone, or two or more types of these electrode substances may be used in combination. The anode may include a single layer, or include a plurality of layers.

In a case where the anode is used as a reflection electrode, for example, chromium, aluminum, silver, titanium, tungsten, molybdenum, an alloy of these, or a laminate of these can be used. In a case where the anode is used as a transparent electrode, an oxide transparent conductive layer made of indium tin oxide (ITO) or indium zinc oxide can be used. The disclosure, however, is not limited to these. A photolithographic technique can be used to form the electrode.

By contrast, it is desirable that the constituent material of the cathode should have a small work function. For example, an alkali metal, such as lithium, an alkaline earth metal, such as calcium, a metal simple substance such as aluminum, titanium, manganese, silver, lead, or chromium, or a mixture containing these can be used. Alternatively, an alloy obtained by combining these metal simple substances can also be used. For example, magnesium-silver, aluminum-lithium, aluminum-magnesium, silver-copper, or zinc-silver can be used. A metal oxide, such as indium tin oxide (ITO) can also be used. One type of these electrode substances may be used alone, or two or more types of these electrode substances may be used in combination. The cathode may include a single layer, or may include multiple layers. It is desirable to use silver among these. To prevent or reduce the clumping of silver, it is more desirable to use a silver alloy. The ratio of the alloy does not matter so long as the clumping of silver can be prevented or reduced. The ratio of the alloy may be 1:1, for example.

The cathode may be a top emission element using an oxide conductive layer made of ITO, or may be a bottom emission element using a reflection electrode made of aluminum (Al). The cathode is not particularly limited. Although a method for forming the cathode is not particularly limited, it is more desirable to use a direct current and alternating current sputtering method because this results in excellent coverage of a film and facilitates a reduction in resistance.

Protection Layer

A protection layer may be provided over the cathode. For example, glass provided with a moisture absorbent is bonded onto the cathode, thus preventing water from entering the organic compound layer. This prevents a display failure from occurring. As another exemplary embodiment, a passivation film made of silicon nitride may be provided over the cathode to prevent water from entering an organic EL layer. For example, after the cathode is formed, the resultant may be conveyed to another chamber without breaking a vacuum, and a silicon nitride film having a thickness of 2 µm may be formed by a chemical vapor deposition (CVD) method to obtain a protection layer. After the film is formed by the CVD method, a protection layer may be provided using an atomic layer deposition (ALD) method.

Color Filter

A color filter may be provided over the protection layer. For example, a color filter taking into account the size of the organic light-emitting element may be provided over another substrate, and the resultant and the substrate on which the organic light-emitting element is provided may be bonded together. Alternatively, a color filter may be patterned on the protection layer using a photolithographic technique. The color filter may include high molecules.

Planarization Layer

A planarization layer may be included between the color filter and the protection layer. The planarization layer may include an organic compound, and may include low molecules or high molecules. It is, however, desirable that the planarization layer should include high molecules.

Planarization layers may be provided over and below the color filter. The constituent materials of the planarization layers may be the same or different. More specifically, examples of the constituent materials of the planarization layers include a polyvinyl carbazole resin, a polycarbonate resin, a polyester resin, an acrylonitrile butadiene styrene (ABS) resin, an acrylic resin, a polyimide resin, a phenolic resin, an epoxy resin, a silicon resin, and a urea resin.

Opposing Substrate

An opposing substrate may be included over the planarization layer. The opposing substrate is termed "opposing substrate" because the opposing substrate is provided at a position opposed to the substrate. The constituent material of the opposing substrate may be the same as that of the substrate.

Organic Layers

Organic compound layers (a hole injection layer, a hole transport layer, an electron blocking layer, a light-emitting layer, a hole blocking layer, an electron transport layer, or an electron injection layer) included in an organic light-emitting element according to an exemplary embodiment are formed by a method illustrated below.

The organic compound layers included in the organic light-emitting element according to an exemplary embodiment can be formed using a vacuum vapor deposition method, an ionized vapor deposition method, or a sputtering or plasma dry process. Instead of the dry process, a wet process for forming each layer by dissolving a material into an appropriate solvent and performing a known application method (e.g., spin coating, dipping, a casting method, a Langmuir-Blodgett (LB) method, or an inkjet method) can also be used.

If the layers are formed by the vacuum vapor deposition method or the solution application method, crystallization is less likely to occur, and the stability over time is excellent. In a case where a film is formed by the application method, the film can also be formed in combination with an appropriate binder resin.

Examples of the binder resin include a polyvinyl carbazole resin, a polycarbonate resin, a polyester resin, an ABS resin, an acrylic resin, a polyimide resin, a phenolic resin, an epoxy resin, a silicon resin, and a urea resin. These resins are merely examples, and the binder resin is not limited to these.

One type of these binder resins may be used alone as a homopolymer or a copolymer, or two or more types of these binder resins may be used in a mixed manner Further, an additive, such as a known plasticizer, a known antioxidant, or a known ultraviolet absorber, may be used in combination, where necessary.

Applications of Semiconductor Device

The semiconductor device according to the first or second exemplary embodiment can be used as a display unit of each of various electronic devices. Examples of the various electronic devices include a digital camera, a video camera, a head-mounted display (a goggle display), a game apparatus, an automotive navigation system, a personal computer, a mobile information terminal, an electronic book, and a television receiver. With reference to the drawings, specific examples will be described below.

Figure 7A:
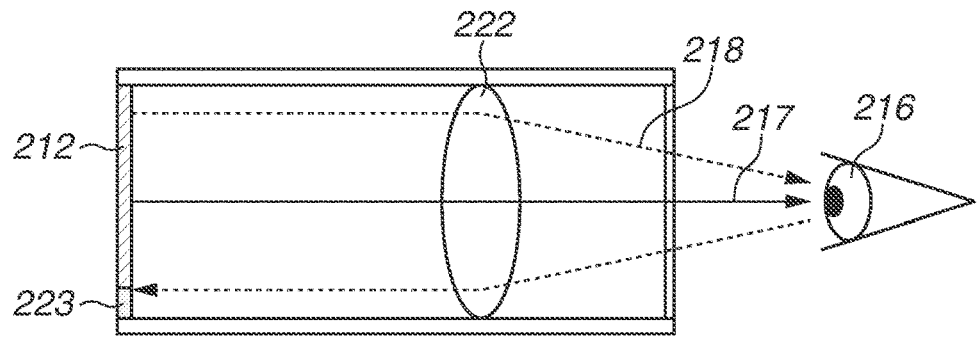
FIGS. 7A, 7B, and 7C are schematic diagrams illustrating examples of applications of a semiconductor device.
Figure 7B:
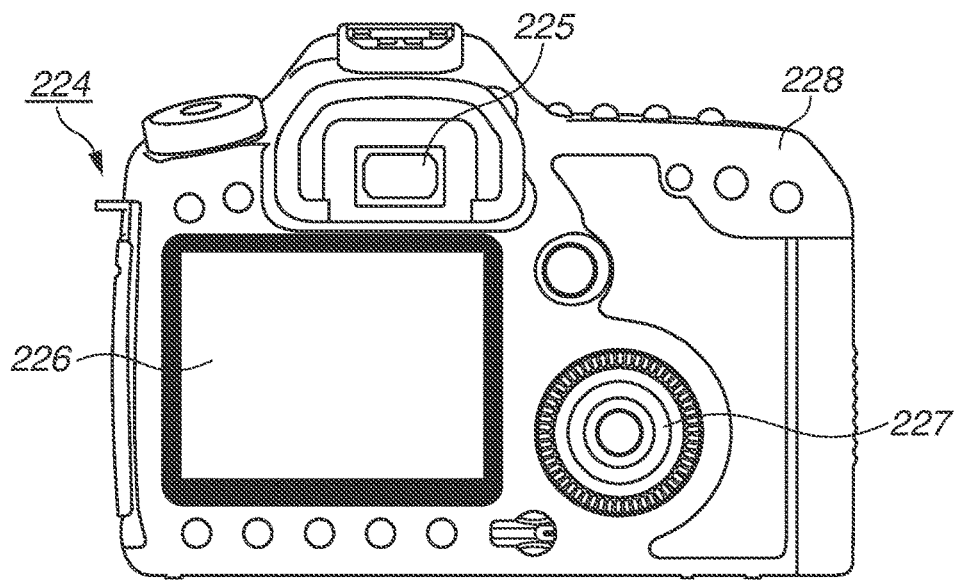
Figure 7C:
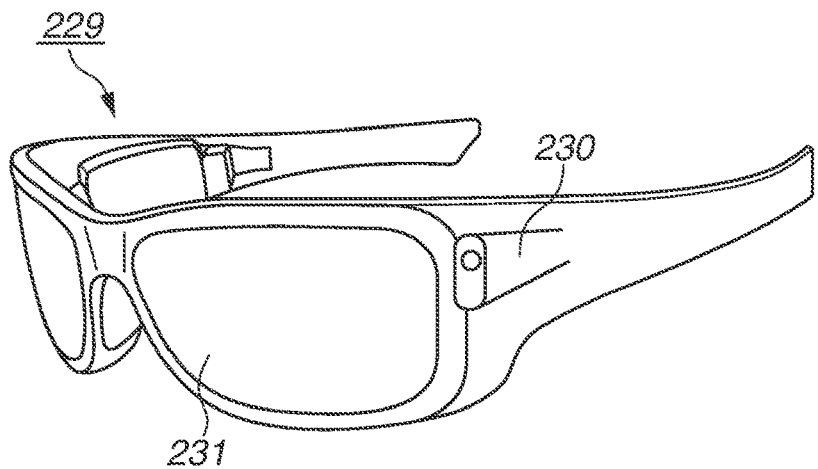

FIGS. 7A, 7B, and 7C illustrate examples of the applications of the semiconductor device as a display apparatus. The display apparatus using the semiconductor device according to the first or second exemplary embodiment can be applied to an information display apparatus, such as a viewfinder of a camera, a head-mounted display, or smartglasses.

FIG. 7A is a diagram illustrating the general configuration of an example where the display apparatus using the semiconductor device is used as a viewfinder of an imaging apparatus, such as a camera. A display apparatus 212 emits display light 217 and infrared light 218, and the display light 217 and the infrared light 218 pass through the same optical member 222 and reach an eyeball 216 of a user. The infrared light 218 reflected by the eyeball 216 of the user is converted into electric information by an imaging apparatus 223 that includes an imaging element. Based on the information, the line of sight is detected. Instead of providing the imaging apparatus 223, an imaging element may be provided on an insulating layer of the display apparatus 212, and the display apparatus 212 with the imaging element may be used as a display imaging apparatus.

FIG. 7B is an example of an imaging apparatus, such as a camera. An imaging apparatus 224 includes a viewfinder 225, a display 226, an operation unit 227, and a housing 228. The display apparatus 212 in FIG. 7A is provided in the viewfinder 225.

While FIG. 7A illustrates an example where the display light 217 and the infrared light 218 pass through the same optical member 222, different optical members may be provided for the display light 217 and the infrared light 218. Instead of providing the imaging apparatus 224, an imaging element may be provided on a substrate of the display apparatus 212, and the display apparatus 212 with the imaging element may be used as a display imaging apparatus. Line-of-sight information regarding the detected line of sight can be used for control of the display apparatus 212 or various devices connected to the display apparatus 212, such as control of the focus of a camera, control of the resolution of a display image, or an alternative to a button operation.

The display apparatus including the semiconductor device according to the first or second exemplary embodiment may include an imaging apparatus including a light-receiving element and control a display image on the display apparatus based on line-of-sight information regarding the user from the imaging apparatus.

More specifically, based on the line-of-sight information, the display apparatus determines a first field-of-view region at which the user gazes and a second field-of-view region other than the first field-of-view region. The first and second field-of-view regions may be determined by a control apparatus of the display apparatus, or the display apparatus may receive information about the first and second field-of-view regions determined by an external control apparatus. In a display region of the display apparatus, the display resolution of the first field-of-view region may be controlled to be higher than the display resolution of the second field-of-view region. That is, the resolution of the second field-of-view region may be set to be lower than that of the first field-of-view region.

The display region includes a first display region and a second display region different from the first display region, and based on the line-of-sight information, a region having high priority is determined from the first and second display regions. The first and second display regions may be determined by the control apparatus of the display apparatus, or the display apparatus may receive the first and second display regions determined by the external control apparatus. The resolution of the region having high priority may be controlled to be higher than the resolution of the region other than the region having high priority. That is, the resolution of the region having relatively low priority may be set to be low.

The first field-of-view region and the region having high priority may be determined using artificial intelligence (AI). The AI may be a model configured to, using, as teacher data, images of eyeballs and directions actually viewed by the eyeballs in the image, estimate the angle of the line of sight and the distance from an object in the line of sight based on an image of an eyeball. An AI program may be included in the display apparatus, or may be included in the imaging apparatus, or may be included in an external apparatus. In a case where the AI program is included in the external apparatus, the AI program is transmitted from the external apparatus to the display apparatus through communication.

In a case where display control is performed based on line-of-sight detection, the display apparatus can be suitably applied to smartglasses further including an imaging apparatus that captures outside. The smartglasses is capable of displaying information regarding captured outside in real time.

Alternatively, a first imaging apparatus that includes a light-receiving element for receiving infrared light, and a second imaging apparatus that includes a light-receiving element different from that of the first imaging apparatus and captures outside may be included. The imaging resolution of the second imaging apparatus may be controlled based on information regarding line-of-sight of a user of the first imaging apparatus. As compared with a region given priority, the imaging resolution is reduced in another region, thus reducing the amount of information. Accordingly, it is possible to reduce power consumption and reduce display delay. The region given priority may be defined as a first imaging region, and the region having lower priority than the first imaging region may be defined as a second imaging region.

FIG. 7C is a schematic diagram illustrating an example of smartglasses. An imaging display apparatus 229 typified by smartglasses includes a control unit 230, a transparent display unit 231, and an external imaging unit (not illustrated). If the display apparatus using the semiconductor device is applied to smartglasses, both the display apparatus and an external imaging apparatus can be controlled based on line-of-sight information regarding the detected line of sight. This reduces power consumption and display delay. For example, in a display region, the display and the imaging resolution of a region other than a region gazed at by the user are reduced, thus reducing the amount of information regarding both imaging and display. This reduces power consumption and display delay.

The display apparatus including the semiconductor device according to the first or second exemplary embodiment can be used as a component member of a display apparatus or an illumination apparatus described below. Alternatively, such a display apparatus can be applied to an exposure light source of an electrophotographic image forming apparatus, a backlight of a liquid crystal display apparatus, or a light-emitting apparatus including a color filter in a white light source.

The display apparatus may be an image information processing apparatus that includes an image input unit to which image information from an area charge-coupled device (CCD), a linear CCD, or a memory card is input, includes an information processing unit that processes the input information, and displays an input image on a display unit.

A display unit included in an imaging apparatus or an inkjet printer may have a touch panel function. A method for driving the touch panel function may be an infrared method, a capacitive method, a resistive method, or an electromagnetic induction method, and is not particularly limited. The display apparatus may be used in a display unit of a multifunction printer.

Figure 8:
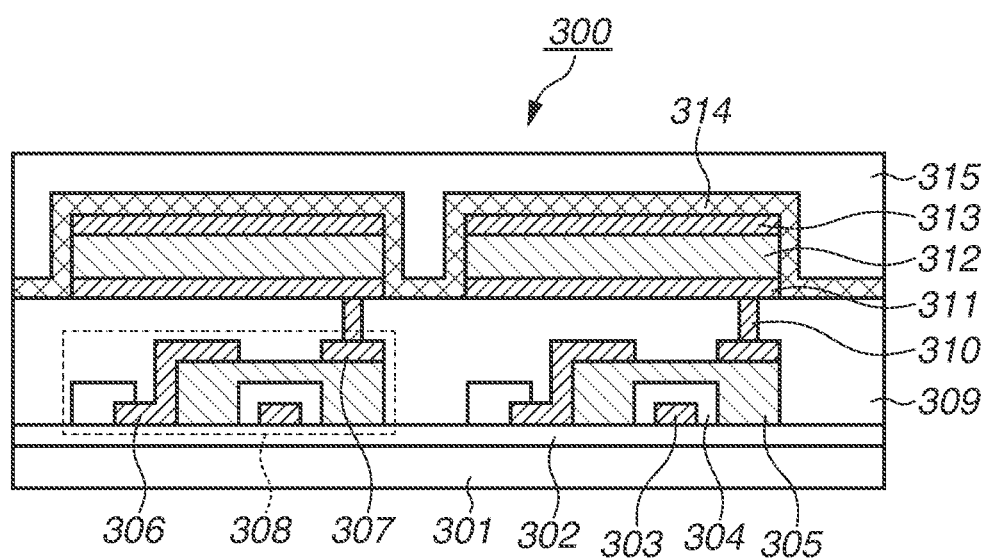
FIG. 8 is a schematic sectional view of an example of a display imaging apparatus.

Next, with reference to accompanying drawings, a display apparatus according to an exemplary embodiment will be described. FIG. 8 is a schematic cross-sectional view illustrating an example of a display apparatus including an organic light-emitting element and a thin-film transistor (TFT) element connected to the organic light-emitting element. The TFT element is an example of an active element.

In a display apparatus 300 in FIG. 8, a substrate 301 made of glass is provided, and a moisture-proof film 302 that protects a TFT element or an organic compound layer is provided over the substrate 301. Further, a gate electrode 303 made of a metal, a gate insulating film 304, and a semiconductor layer 305 are provided.

A TFT element 308 includes the semiconductor layer 305, a drain electrode 306, and a source electrode 307. An insulating film 309 is provided over the TFT element 308. An anode 311 and the source electrode 307 included in an organic light-emitting element are connected together via a contact hole 310.

A method for electrically connecting an electrode (the anode 311 or a cathode 313) included in the organic light-emitting element and an electrode (the source electrode 307 or the drain electrode 306) included in the TFT element 308 is not limited to the form illustrated in FIG. 8. That is, either the anode 311 or the cathode 313 only needs to be electrically connected to either one of the source electrode 307 and the drain electrode 306 of the TFT element 308.

While FIG. 8 illustrates an example where the display apparatus 300 includes a single organic compound layer 312, the display apparatus 300 may include a plurality of organic compound layers 312. A first protection layer 314 and a second protection layer 315 that prevent the deterioration of the organic light-emitting element are provided over the cathode 313.

Although the display apparatus 300 in FIG. 8 uses a transistor as a switching element, a metal-insulator-metal (MIM) element may be used as the switching element instead of the transistor.

The transistor used in the display apparatus 300 in FIG. 8 is not limited to a transistor including a monocrystalline silicon wafer, and may be a thin-film transistor including an active layer over an insulating surface of a substrate. Examples of the active layer include monocrystalline silicon, amorphous silicon, non-monocrystalline silicon, such as microcrystalline silicon, and non-monocrystalline oxide semiconductors made of indium zinc oxide and indium gallium zinc oxide. The thin-film transistor is also termed a "TFT element".

The transistor included in the display apparatus 300 in FIG. 8 may be formed in a substrate, such as a Si substrate.

The transistor which is formed in the substrate means the transistor that is produced by processing the substrate such as a Si substrate itself. That is, the state where the transistor is included in the substrate can also be regarded as the state where the substrate and the transistor are integrally formed.

The light emission luminance of an organic light-emitting element according to the present exemplary embodiment is controlled by a TFT, which is an example of a switching element, and organic light-emitting elements are provided in a plurality of surfaces, so that images are displayed with the light emission luminances of the respective organic light-emitting elements. A switching element according to the present exemplary embodiment is not limited to the TFT, and may be a transistor formed of low-temperature polysilicon or an active matrix driver formed on a substrate, such as a Si substrate. Here, "on a substrate" can also be said to be "in the substrate". Whether to provide the transistor in a substrate or use the TFT is selected according to the size of the display unit. If the size of the display unit is about 0.5 inches, for example, it is desirable to provide the organic light-emitting element on a Si substrate.

Figure 9:
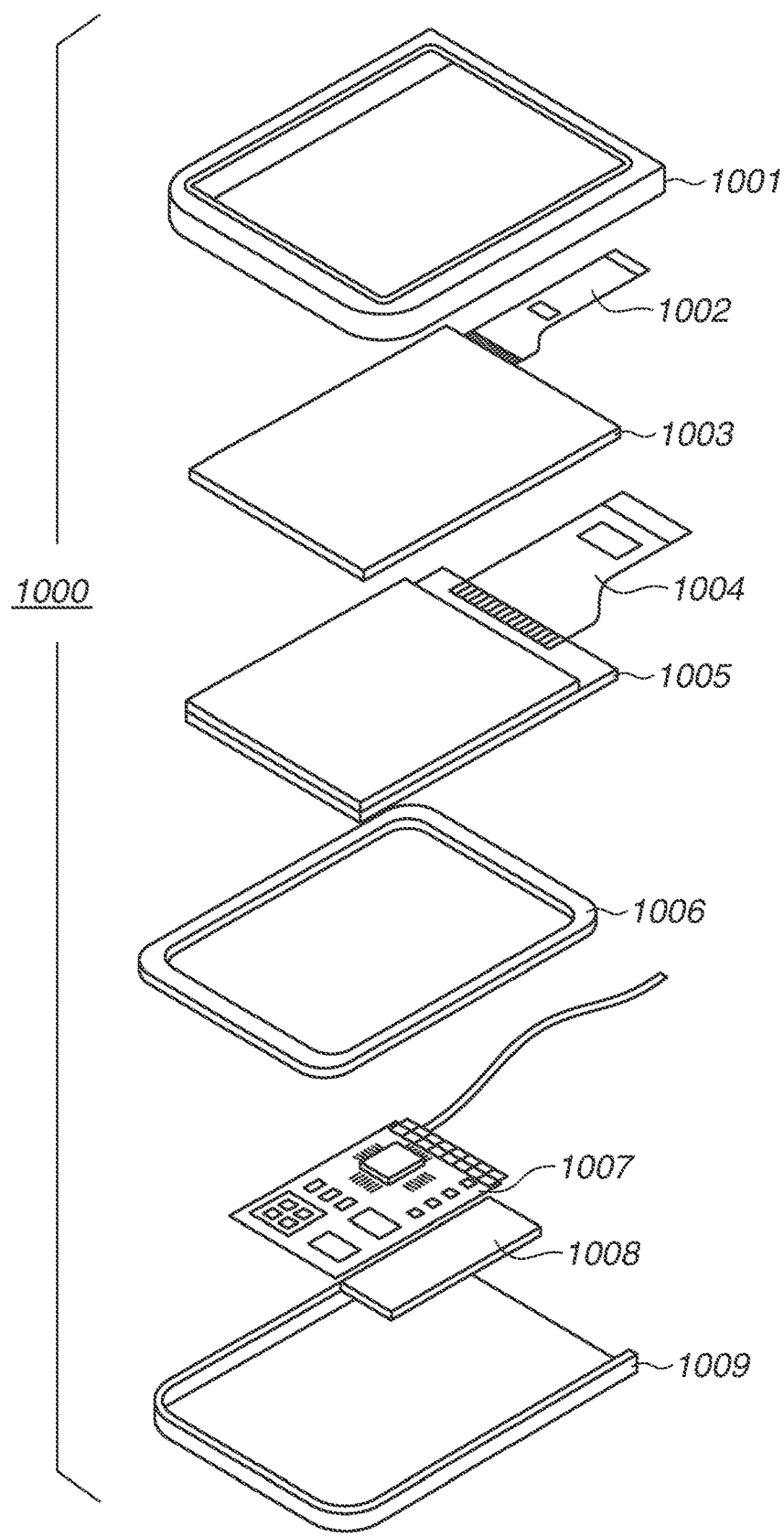
FIG. 9 is a schematic sectional view of an example of a display apparatus.

FIG. 9 is a schematic diagram illustrating an example of a display apparatus according to the present exemplary embodiment. A display apparatus 1000 may include a touch panel 1003, a display panel 1005, a frame 1006, a circuit board 1007, and a battery 1008 between an upper cover 1001 and a lower cover 1009. The touch panel 1003 and the display panel 1005 are connected to flexible printed circuits (FPCs) 1002 and 1004, respectively. On the circuit board 1007, a transistor is printed. The battery 1008 may not be provided unless the display apparatus 1000 is a mobile device, or may be provided at another position even if the display apparatus 1000 is a mobile device.

The display apparatus 1000 according to the present exemplary embodiment may be used in a display unit of a photoelectric conversion apparatus including an optical unit that includes a plurality of lenses, and an imaging element that receives light having passed through the optical unit. The photoelectric conversion apparatus may include a display unit that displays information acquired by the imaging element. Alternatively, the photoelectric conversion apparatus may acquire information using the information acquired by the imaging element, and the display unit may display information different from the acquired information. The display unit may be a display unit exposed to outside the photoelectric conversion apparatus, or may be a display unit placed in a viewfinder. The photoelectric conversion apparatus may be a digital camera or a digital video camera.

Figure 10A:
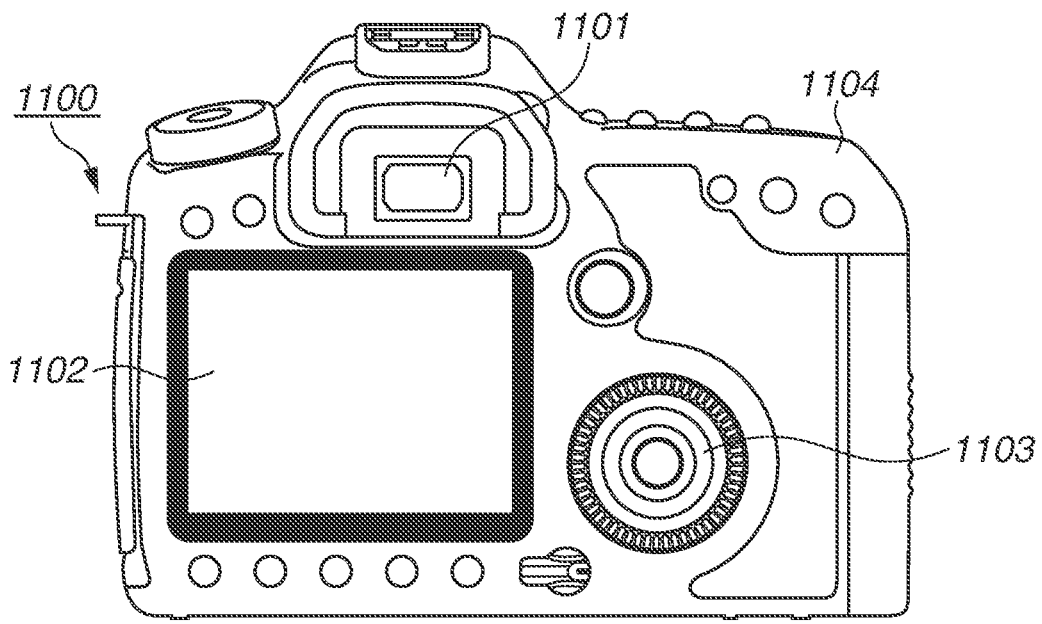
FIG. 10A is a schematic diagram illustrating an example of an imaging apparatus.

FIG. 10A is a schematic diagram illustrating an example of a photoelectric conversion apparatus according to the present exemplary embodiment. A photoelectric conversion apparatus 1100 may include a viewfinder 1101, a back surface display 1102, an operation unit 1103, and a housing 1104. The viewfinder 1101 may include the semiconductor device according to the first or second exemplary embodiment as a display apparatus. In such a case, the display apparatus may display not only an image captured, but also environment information and an image capturing instruction. The environment information may include the intensity of external light, the direction of external light, the moving speed of an object, and the possibility that an object is blocked by a blocking object.

Since a timing suitable for capturing an image lasts for a short time, the information should be displayed as soon as possible. Thus, it is desirable to use the display apparatus using the organic light-emitting element according to the aspect of the embodiments. This is because the response speed of the organic light-emitting element is fast. The display apparatus using the organic light-emitting element can be used more suitably than these apparatuses and a liquid crystal display apparatus, which require a fast display speed.

The photoelectric conversion apparatus 1100 includes an optical unit (not illustrated). The optical unit includes a plurality of lenses and forms an image on an imaging element accommodated in the housing 1104. The focus can be adjusted by adjusting the relative positions between the plurality of lenses. This operation can also be performed automatically.

The display apparatus according to the present exemplary embodiment may include color filters having red, green, and blue. In the color filters, the red, the green, and the blue are arranged in delta arrangement.

The display apparatus according to the present exemplary embodiment may be used in a display unit of a mobile terminal. At this time, the display apparatus may have both a display function and an operation function. Examples of the mobile terminal include a mobile phone, such as a smartphone, a tablet, and a head-mounted display.

Figure 10B:
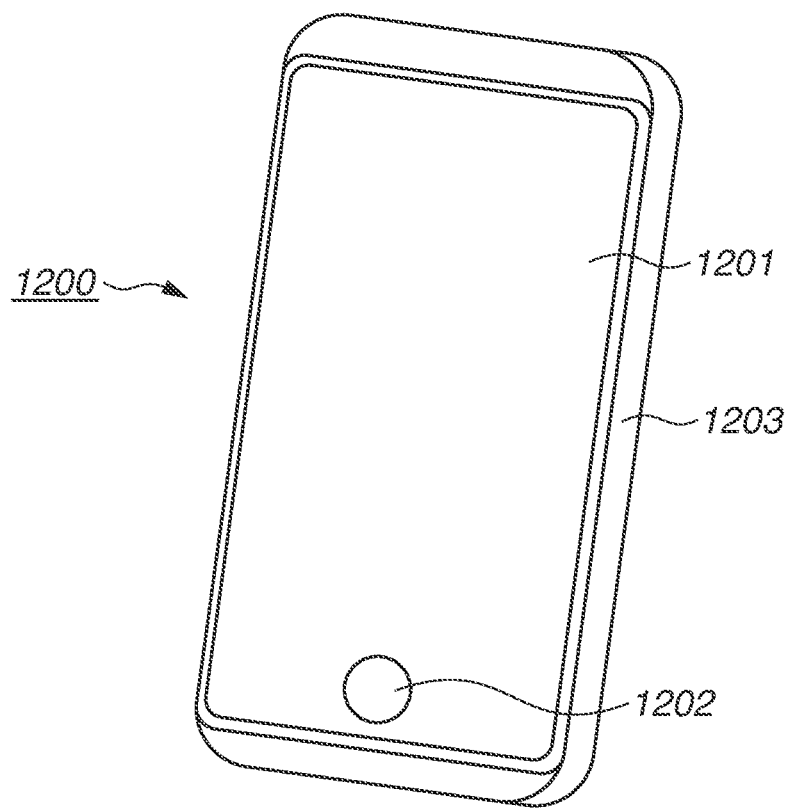
FIG. 10B is a schematic diagram illustrating an example of an electronic device.

FIG. 10B is a schematic diagram illustrating an example of an electronic device according to the present exemplary embodiment. An electronic device 1200 includes a display unit 1201, an operation unit 1202, and a housing 1203. The housing 1203 may include a circuit, a printed circuit board including the circuit, a battery, and a communication unit. The operation unit 1202 may be a button, or may be response unit using a touch panel method. The operation unit 1202 may be a biometric unit that recognizes a fingerprint and releases a lock. The electronic device 1200 including the communication unit can also be referred to as a communication device. The display unit 1201 can include the semiconductor device according to the first or second exemplary embodiment.

Figure 11A:
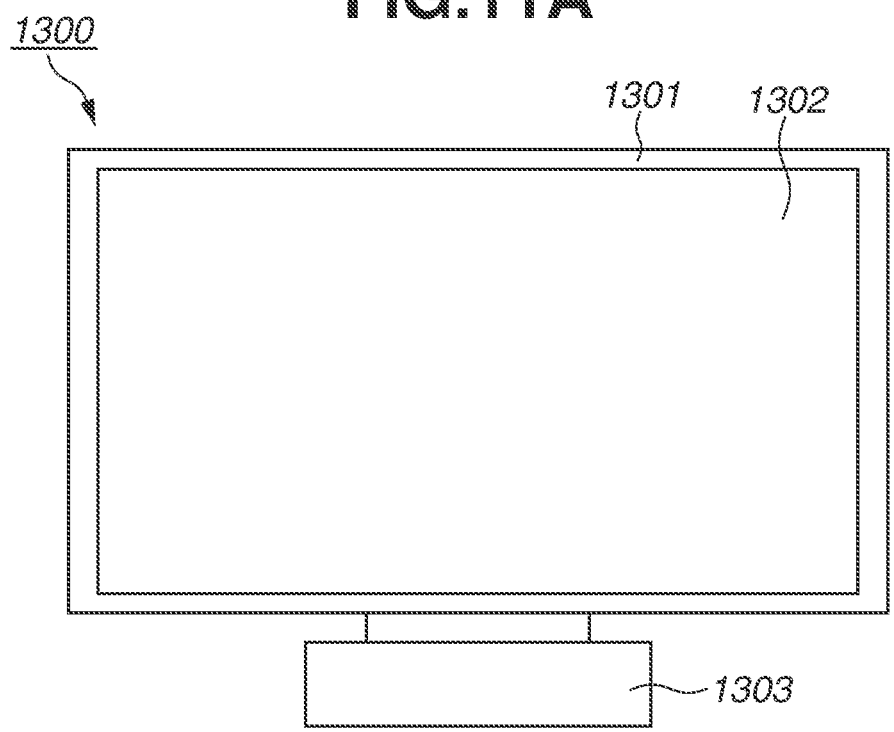
FIG. 11A is a schematic diagram illustrating an example of a display apparatus.

FIG. 11A is a schematic diagram illustrating an example of a case where the semiconductor device according to the present exemplary embodiment is a display apparatus. FIG. 11A illustrates a display apparatus, such as a television monitor and a personal computer (PC) monitor. A display apparatus 1300 includes a frame 1301 and a display unit 1302. The semiconductor device according to the first or second exemplary embodiment may be included in the display unit 1302.

The display apparatus 1300 includes a base 1303 that supports the frame 1301 and the display unit 1302. The base 1303 is not limited to the form in FIG. 11A. The lower side of the frame 1301 may double as a base.

The frame 1301 and the display unit 1302 may be curved. The radius of curvature of the curve may be 5000 mm or more and 6000 mm or less.

Figure 11B:
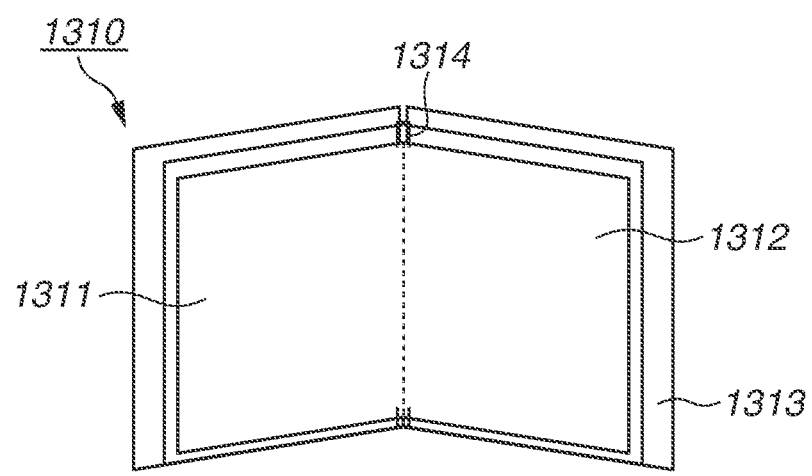
FIG. 11B is a schematic diagram illustrating an example of a foldable display apparatus.

FIG. 11B is a schematic diagram illustrating another example of the case where the semiconductor device according to the present exemplary embodiment is a display apparatus. A display apparatus 1310 in FIG. 11B is a foldable display apparatus which is foldable. The display apparatus 1310 includes a first display unit 1311, a second display unit 1312, a housing 1313, and a folding point 1314. The first display unit 1311 and the second display unit 1312 may include the semiconductor device according to the exemplary embodiment. The first display unit 1311 and the second display unit 1312 may be a single display apparatus without a joint. The first display unit 1311 and the second display unit 1312 can be divided at the folding point 1314. The first display unit 1311 and the second display unit 1312 may display images different from each other, or may display a single image.

Figure 12A:
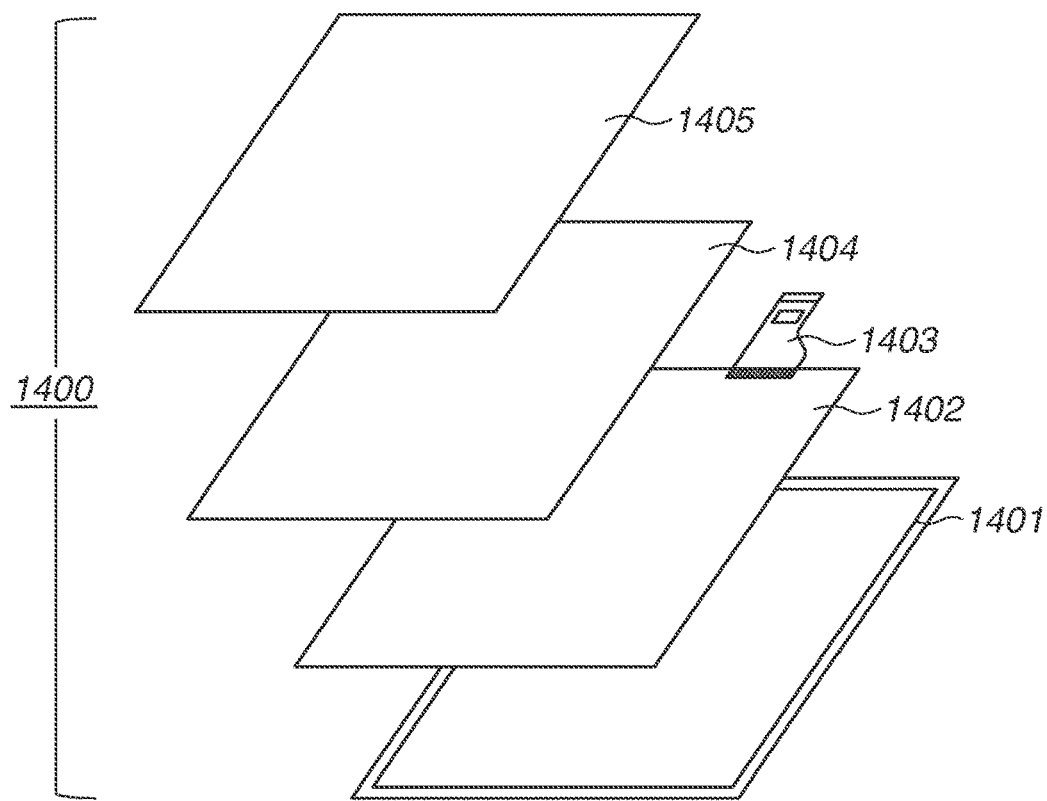
FIG. 12A is a schematic diagram illustrating an example of an illumination apparatus.

FIG. 12A is a schematic diagram illustrating an example of an illumination apparatus according to the present exemplary embodiment. An illumination apparatus 1400 may include a housing 1401, a light source 1402, a circuit board 1403, an optical film 1404, and a light diffusion portion 1405. The light source 1402 may include the semiconductor device according to the first or second exemplary embodiment. In such a case, image data input to each pixel may not form an image when the image data is displayed, and may be a signal corresponding to the same luminance.

The optical film 1404 may be a filter for improving the color rendering properties of the light source 1402. The light diffusion portion 1405 can effectively diffuse light of the light source 1402 by lighting up and deliver light to a wide range. The optical film 1404 and the light diffusion portion 1405 may be transmissive, and may be provided on the light exit side of the illumination. A cover may be provided in an outermost portion of the illumination apparatus 1400, where necessary.

The illumination apparatus 1400 is, for example, an apparatus that illuminates the inside of a room. The illumination apparatus 1400 may emit light of white, daylight white, or any of colors from blue to red. The illumination apparatus 1400 may include a light modulation circuit that modulates the light. The illumination apparatus 1400 may include the semiconductor device according to the first or second exemplary embodiment. For example, the illumination apparatus 1400 may include an organic light-emitting element and a power supply circuit connected to the organic light-emitting element. The power supply circuit is a circuit that converts an alternating current voltage into a direct current voltage. The color temperature of white is 4200 K, and the color temperature of daylight white is 5000 K. The illumination apparatus 1400 may include a color filter.

The illumination apparatus 1400 according to the present exemplary embodiment may include a heat release portion. The heat release portion releases heat in the apparatus to outside the apparatus. Examples of the heat release portion include a metal having high specific heat and liquid silicon.

Figure 12B:
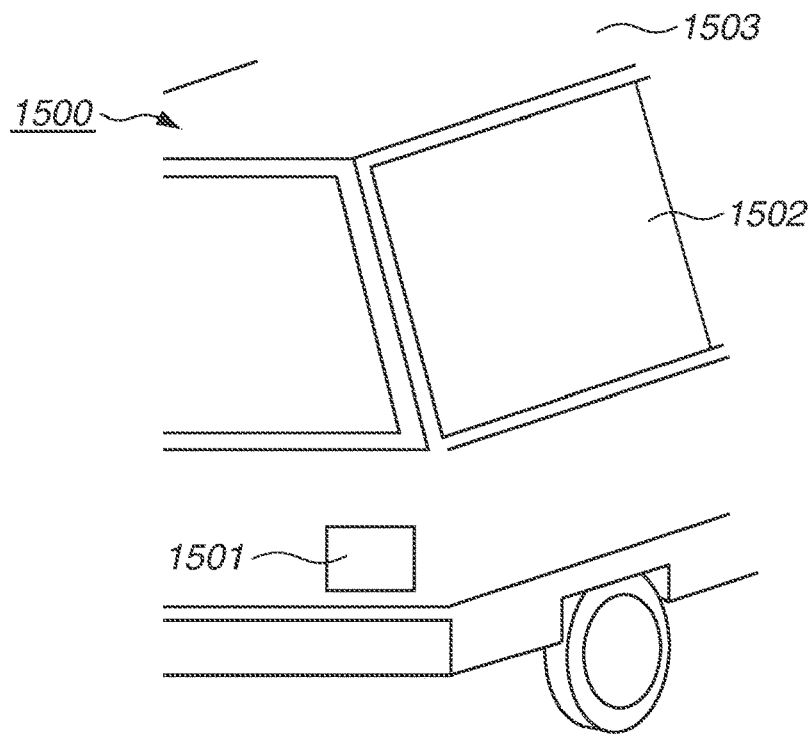
FIG. 12B is a schematic diagram illustrating an example of an automobile including a vehicle lamp fitting.

FIG. 12B is a schematic diagram illustrating an automobile which is an example of a moving object according to the present exemplary embodiment. The automobile includes a taillight which is an example of a lamp fitting. An automobile 1500 may include a taillight 1501 and have a form in which when a brake operation is performed, the automobile 1500 lights up the taillight 1501.

The taillight 1501 may include the semiconductor device according to the first or second exemplary embodiment, as an illumination apparatus. The taillight 1501 may include a protection member that protects an organic EL element. The material of the protection member does not matter so long as the material has somewhat high strength and is transparent. It is, however, desirable that the protection member should be formed of polycarbonate. The polycarbonate may be mixed with a furandicarboxylic acid derivative and/or an acrylonitrile derivative.

The automobile 1500 may include a vehicle body 1503 and a window 1502 attached to the vehicle body 1503. The window 1502 may be a transparent display if the window 1502 is not a window for checking the front and the rear of the automobile 1500. The transparent display may include the semiconductor device according to the first or second exemplary embodiment. In such a case, the constituent materials included in an organic light-emitting element, such as electrodes, is formed of a transparent member.

The moving object according to the present exemplary embodiment may be a vessel, an aircraft, or a drone. The moving object may include a body and a lamp fitting provided on the body. The lamp fitting may emit light to notify the user of the position of the body. The lamp fitting includes the semiconductor device according to the first or second exemplary embodiment as an illumination apparatus.

As described above, the application of the semiconductor device according to the first or second exemplary embodiment enables stable display even in long-time display with excellent image quality.

While the disclosure has been described with reference to exemplary embodiments, it is to be understood that the disclosure is not limited to the disclosed exemplary embodiments. The scope of the following claims is to be accorded the broadest interpretation so as to encompass all such modifications and equivalent structures and functions.

This application claims the benefit of Japanese Patent Application No. 2019-216773, filed Nov. 29, 2019, which is hereby incorporated by reference herein in its entirety.

What is claimed is:

1. A semiconductor device comprising:
   a first substrate;
   a color filter layer over the first substrate in an effective pixel region, the color filter layer having a color filter material;
   a second substrate over the color filter layer;
   a joint member joining the first and second substrates; and
   a pattern layer over the first substrate outside the effective pixel region, the pattern layer having the color filter material,
   wherein, in a planar view with respect to a surface of the first substrate on which the joint member is disposed, the pattern layer is disposed between two portions of the joint member, the two portions being separate from and adjacent to each other, and
   wherein, in the planar view, the joint member is not disposed between the pattern layer and an end of the first substrate closest to the pattern layer among ends of the first substrate.

2. The semiconductor device according to claim 1, wherein the two portions of the joint member and the pattern layer are disposed side by side on a straight line parallel to an outer edge of at least a part of the effective pixel region and not passing through the effective pixel region.

3. The semiconductor device according to claim 1, wherein the pattern layer includes layers of a plurality of colors similar to colors of the color filter layer, and
   wherein, in the planar view, an area per pattern unit of a certain color of the pattern layer is different in size from an area per pixel of the color of the color filter layer.

4. The semiconductor device according to claim 3, wherein, in the planar view, the area per pattern unit of the color of the pattern layer is greater than the area per pixel of the color of the color filter layer.

5. The semiconductor device according to claim 3, wherein, in the planar view, the area per pattern unit of the color of the pattern layer is 1.5 times or more the area per pixel of the color of the color filter layer.

6. The semiconductor device according to claim 1, wherein the pattern layer includes layers of a plurality of colors similar to colors of the color filter layer, and
   wherein the pattern layer has a pattern in which, in the planar view, a shape of a layer of a certain color among the layers of the plurality of colors is different from a shape per pixel of a layer of the certain color of the color filter layer.

7. The semiconductor device according to claim 1, wherein, in the planar view, the color filter layer and the pattern layer are separate from each other.

8. The semiconductor device according to claim 1, wherein, in the planar view, a distance between the joint member and the pattern layer is greater than a distance between an end of the first substrate and the pattern layer.

9. The semiconductor device according to claim 1, wherein a layer of a same color as at least one of colors of layers included in the color filter layer is disposed between the color filter layer and the joint member.

10. The semiconductor device according to claim 9, wherein a part of the layer of the at least one color is disposed between the color filter layer and the pattern layer.

11. The semiconductor device according to claim 9, wherein, in the planar view, the layer of the at least one color and the pattern layer are separate from each other.

12. The semiconductor device according to claim 1, wherein the effective pixel region includes a plurality of pixels, and at least one of the plurality of pixels includes an organic light-emitting element and a transistor connected to the organic light-emitting element.

13. A display imaging apparatus comprising:
   an imaging apparatus; and
   the semiconductor device according to claim 1 as a display unit,
   wherein a display image on the display unit is controlled based on information about line-of-sight of a user, the information being provided by the imaging apparatus.

14. A photoelectric conversion apparatus comprising:
   an optical unit including a plurality of lenses;
   an imaging element configured to receive light having passed through the optical unit; and
   a display unit configured to display an image captured by the imaging element,
   wherein the display unit includes the semiconductor device according to claim 1.

15. An electronic device comprising:
   a display unit including the semiconductor device according to claim 1;
   a housing in which the display unit is provided; and
   a communication unit provided in the housing and configured to communicate with outside.

16. An illumination apparatus comprising:
   a light source including the semiconductor device according to claim 1; and
   a light diffusion portion or an optical film through which light emitted from the light source is transmitted.

17. A moving object comprising:
   a lamp fitting including the semiconductor device according to claim 1; and
   a body in which the lamp fitting is provided.

18. A semiconductor device comprising:
   a first substrate;
   a color filter layer over the first substrate in an effective pixel region, the color filter layer having a color filter material;
   a second substrate over the color filter layer;
   a joint member on the first substrate along an outer edge of the effective pixel region, the joint member joining the first substrate and the second substrate; and
   a pattern layer over the first substrate outside the effective pixel region, the pattern layer having the color filter material, wherein, in a planar view with respect to a surface of the first substrate on which the joint member is disposed, the joint member includes two portions separate from and adjacent to each other, wherein, in the planar view, a virtual straight line connecting the two portions of the joint member and the joint member surround the effective pixel region, and wherein the pattern layer is disposed over the virtual straight line.

19. The semiconductor device according to claim 18, wherein the pattern layer includes layers of a plurality of colors similar to colors of the color filter layer, and wherein, in the planar view, an area per pattern unit of a certain color of the pattern layer is different in size from an area per pixel of the color of the color filter layer.

20. The semiconductor device according to claim 18, wherein the pattern layer includes layers of a plurality of colors similar to colors of the color filter layer, and wherein the pattern layer has a pattern in which, in the planar view, a shape of a layer of a certain color among the layers of the plurality of colors is different from a shape per pixel of a layer of the certain color of the color filter layer.

\* \* \* \* \*